United States Patent [19]

Mehlkopf et al.

[11] Patent Number: 5,023,552

[45] Date of Patent: Jun. 11, 1991

[54] MAGNETIC RESONANCE DEVICE WITH A SELECTABLE GAIN SIGNAL AMPLIFIER

[75] Inventors: Antoon F. Mehlkopf; Johannes H. Den Boef, both of Eindhoven; Rolf J. M. Lioen, Landsmeer, all of Netherlands

[73] Assignee: U.S. Philips Corp., New York, N.Y.

[21] Appl. No.: 607,779

[22] Filed: Oct. 24, 1990

Related U.S. Application Data

[63] Continuation of Ser. No. 369,567, Jun. 21, 1989, abandoned.

[51] Int. Cl.[5] ............................................. G01R 33/20
[52] U.S. Cl. ..................................... 324/309; 324/307
[58] Field of Search ............... 324/300, 307, 309, 318, 324/322

[56] References Cited

U.S. PATENT DOCUMENTS

| | | | |
|---|---|---|---|
| 4,070,708 | 1/1978 | Smallcombe | 324/307 |
| 4,700,138 | 10/1987 | Shimazaki | 324/322 |
| 4,703,267 | 11/1987 | Maudsley | 324/307 |

OTHER PUBLICATIONS

Dykstra, Robert W., "An NMR Preamplifier Modification Provides Increased Proton Sensitivity", Jul. 1988, pp. 574–576, vol. 78, No. 3.

Primary Examiner—Michael J. Tokar
Attorney, Agent, or Firm—Jack D. Slobod

[57] ABSTRACT

A magnetic resonance imaging device and method are disclosed in which, during acquisition of measuring data the receiver gain is switched over in dependence of the signal strength, so that in principle every data set of the various measuring cycles has an optimum signal to noise ratio.

15 Claims, 2 Drawing Sheets

MAGNETIC RESONANCE DEVICE WITH A SELECTABLE GAIN SIGNAL AMPLIFIER

This is a continuation of application Ser. No. 369,564, filed on June 21, 1989, and now abandoned.

BACKGROUND OF THE INVENTION

1. Field of the Invention

The invention relates to a magnetic resonance device for determining a nuclear magnetization distribution in a region of an object, which device comprises
  (a) means for generating a steady, uniform magnetic field,
  (b) means for generating RF electromagnetic radiation in order to generate magnetic resonance signals;
  (c) means for generating at least one gradient magnetic field with an adjustable gradient direction in order to influence the magnetic resonance signals,
  (d) a detection chain comprising a signal amplifier for detecting, amplifying and sampling the resonance signal during a measuring period, and an analog-to-digital converter which is connected thereto,
  (e) processing means for processing the sampled resonance signals, and
  (f) control means for controlling at least the means specified sub (b) to (e), resonance signals being conditioned during a preparation period preceding the measuring period, the control means supplying the means specified sub (c) with control signals for adjusting the strength and for the duration of at least one gradient magnetic field such that the integral of the strength of the gradient magnetic field over the preparation period is different, for each conditioned resonance signal to be sampled.

2. Description of the Prior Art

A device of this kind is known from European Patent Application publication No. 0 155 052 corresponding to U.S. Pat. No. 4,682,110 and from British Application No. 2,177,861 which corresponds to U.S. Pat. No. 4,700,138. In such a magnetic resonance device an N-dimensional data set is recorded, producing the desired image or spectrum after an N-dimensional Fourier transformation. Subsequent to an excitation pulse, various so-called spin echoes can be produced by means of 180° echo pulses or by continuously switching over the measuring gradient field after each measuring period, each of said spin echoes being and producing a set of data for said N-dimensional data set. Because of gradient magnetic fields applied during a preparation period and because of T2 relaxations and/or field inhomogeneities, the intensity of the various resonance signals will differ. The greater the influence of the magnetic gradient fields, field inhomogeneities and the longer the time during which the T2 relaxations can occur, the weaker the magnetic resonance signals will be. In a conventional magnetic resonance system in which a nuclear spin density distribution is determined, a set of data having an index n determined by the time integral over the preparatory gradient magnetic field is obtained by sampling a resonance signal influenced by a preparatory gradient magnetic field during a preparation period. During the successive measuring cycles this integral should have different values which form an arithmetical series n.A. The value of n then ranges, for example from −127, via 0 to +128 when an image comprises 256 pixels in a direction defined by the gradient of the preparatory gradient magnetic field. The signal to be sampled for the data set O (no influencing by a preparatory gradient magnetic field) will have the highest amplitude. The signal amplitudes of the signals to be sampled will decrease very quickly, notably in the present case, as a function of the data set index n (certainly for $|n|>2$). Typically, for the images to be reconstructed the strongest signals are concentrated in the central five data sets ($-2<n<2$) and the signal level for the remaining data sets will be at least a factor ten lower. The adjusting means are used for adapting the receiver chain to varying signal strengths over echo resonance signals for different MR images in the case of multiple echo or multiple-slice pulse sequences. Within an image the grain remains constant.

A publication by R. Ernst in Journal of Magnetic Resonance, Vol. 4, 1971, pp. 280-296 states that the effect of the quantization noise (the noise added to a signal upon its conversion from analog to digital form) is negligible when the noise level of the signal on the input of the analog-to-digital converter is effectively at least equal to the least significant bit (=quantization step). When an analog signal is too strong, its amplitude will have to be adapted to the range of an analog-to-digital converter, implying an attenuation of the signal. As a result, the analog-to-digital converter adds noise in the form of quantization noise to the signal. The foregoing can be avoided by taking steps which limit the signal dynamics but which have the drawback that they require additional hardware or additional signal processing. In a magnetic resonance apparatus the receiver is switched over to a lower gain or a higher gain during acquisition of successive echoes in order to drive the analog-to-digital converters to full output. The noise factor of the overall receiver will increase as the receiver gain factor decreases. The signal-to-noise ratio of the images will then be a function of the setting of the gain of the receiver. In the above case the signal-to-noise ratio will be far from optimum.

In the case of a low gain factor of the receiver which will be selected notably for forming a 3-dimensional image and/or for the imaging of thick slices, the noise factor will be increased by several dB, so that a loss mounting to tens of percents occurs in the signal-to-noise ratio. The foregoing is a rather universal problem which is becoming more serious because of the increased strength of the signals to be processed due to improvements in the magnetic resonance receiver coils.

SUMMARY OF THE INVENTION

It is an object of the invention to provide a magnetic resonance apparatus in which steps are taken to minimize the deterioration of the image quality due to the poorer signal-to-noise ratio upon reception of the resonance signals of strongly varying strength.

To achieve this, a magnetic resonance device in accordance with the invention is characterized in that there are provided adjusting means for adjusting a gain of the signal amplifier so that the gain is increased as the signal level of the resonance signal decreases, until the noise factor of the detection chain and the analog-to-digital converter connected thereto has become substantially independent of the gain. In such a magnetic resonance device only a limited number of the total number of resonance signals to be measured is measured with a comparatively poor noise factor, most resonance signals being measured and processed with a good noise factor. It will be evident that the resonance signals which have been measured with a comparatively low gain factor must be corrected as regards amplification and phase before they are further processed so as to form an imaging signal. This amplitude and phase correction can be performed before as well as after the Fourier transformation of the measured resonance signals. A drawback of the proposed magnetic resonance device could consist in that the noise character of the images is no longer uniform in the pseudo time direction. This is due to the fact that the magnetic resonance signals having a poor noise character are situated notably in the range of the better visible low image frequencies and not in the range of the higher image frequencies.

The described problem is mitigated in an embodiment of a magnetic resonance device in accordance with the invention in that the processing and control unit is programmed so that measuring cycles executed with a low gain are repeated, the resonance signals of these measuring cycles which have passed the analog-to-digital converter being averaged. In the described magnetic resonance device an equal noise power is obtained per averaged resonance signal as a result of the comparatively more frequent measurement of the signals having a poor noise factor and their averaging. This results in a more uniform noise character of the images.

To achieve this, an embodiment of a magnetic resonance device in accordance with the invention is characterized in that the processing unit comprises an amplifier setting register in which gain settings are stored which are determined on the basis of at least one resonance signal generated during a test measuring cycle executed prior to a measurement.

A preferred embodiment of a magnetic resonance device is characterized in that the amplifier has only two gain settings.

BRIEF DESCRIPTION OF THE DRAWING

The invention will be described in detail hereinafter with reference to the drawing; therein

DETAILED DESCRIPTION OF THE PREFERRED EMBODIMENTS

Figure 1:
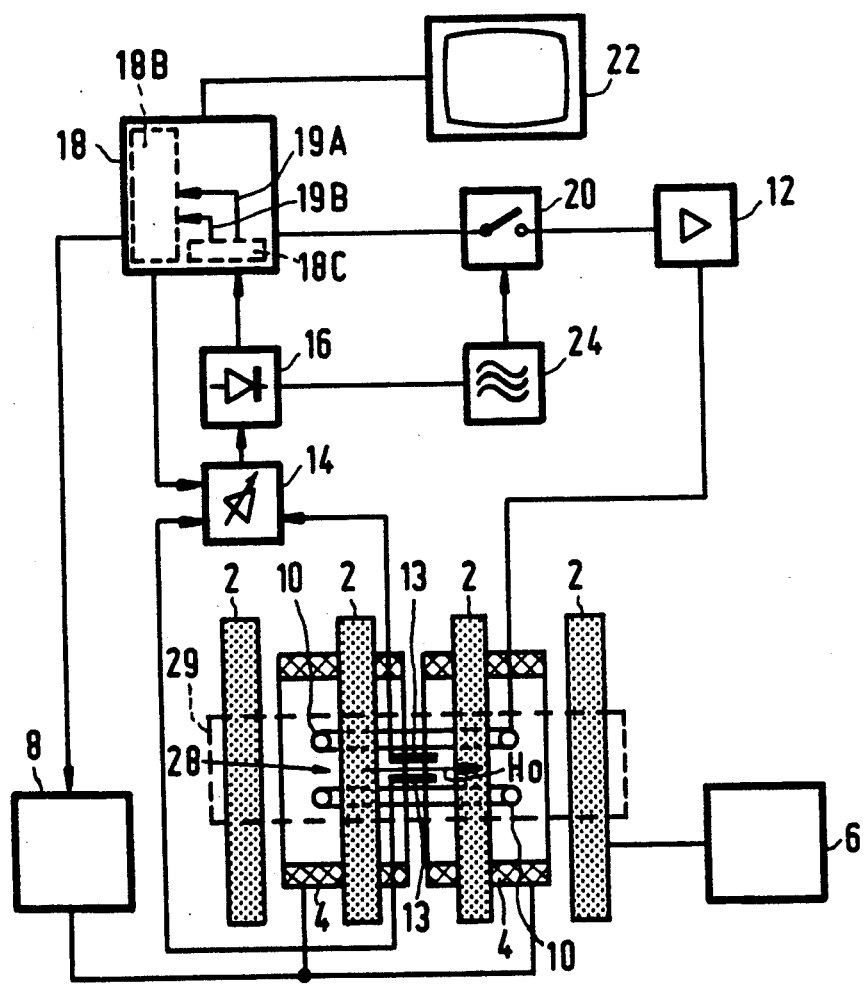
FIG. 1 shows a magnetic resonance apparatus in accordance with the invention.

A spin resonance apparatus as shown in FIG. 1 comprises a magnet system 2 for generating a steady magnetic field B0, a magnet system 4 for generating magnetic gradient fields and power supply sources 6 and 8 for the magnet system 2 and the magnet system 4, respectively. An RF magnet coil 10 serves for generating an RF magnetic alternating field, for which purpose it is fed by the output of an RF amplifier 12. For the detection of the resonance signal generated by the RF transmitter field in an object to be examined, use is made of a receiver coil 13; to this end, this coil is connected to a signal amplifier 14. The signal amplifier 14 is connected to a phase-sensitive rectifier 16 which is connected to a central processor unit 18. The central processor unit 18 processes the signals supplied by the phase-sensitive rectifier 16 and calculates therefrom an image of a region of the object which is to be arranged in an examination space 28. Images of this kind can be displayed on a monitor 22. The central processor unit 18 comprises a central processing and control device 18B which controls a modulator 20 for the RF source 12 and the power supply source 8 for the gradient magnet coils 4 and which adjusts the gain factor of the signal amplifier 14. The amplifier 14 may be actively controlled or may consist of a fixed amplifier with an adjustable attenuator in the amplification path. An RF oscillator 24 controls the modulator 20 as well as the phase-sensitive rectifier 16 which processes the measuring signals. The transmitter coil 10 which is arranged within the magnet systems 2 and 4 encloses an examination space 28 which is large enough to accommodate a patient to be examined in the case of a magnetic resonance device for medical diagnostic purposes. Thus, a steady magnetic field B0, a gradient magnetic field for slice selection and a spatially uniform RF altering field can be generated within the examination space 28. After the generating of an RF magnetic field, the RF coil 10 will be quickly deactivated because subsequently the resonance signal generated must be detected, for example by means of the detection coil 12.

Figure 2:
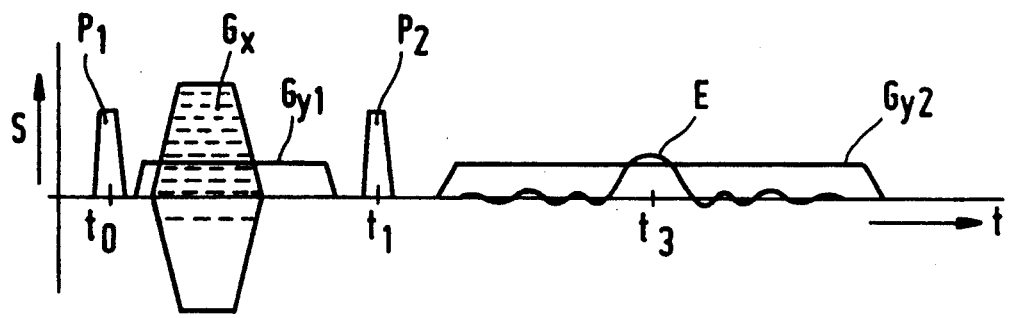
FIG. 2 illustrates a known measuring cycle to be executed by the apparatus shown in FIG. 1, and FIGS. 3a and 3b show gain factor diagrams as a function of the index of a data set to be measured in a measuring cycle.
Figure 3A:
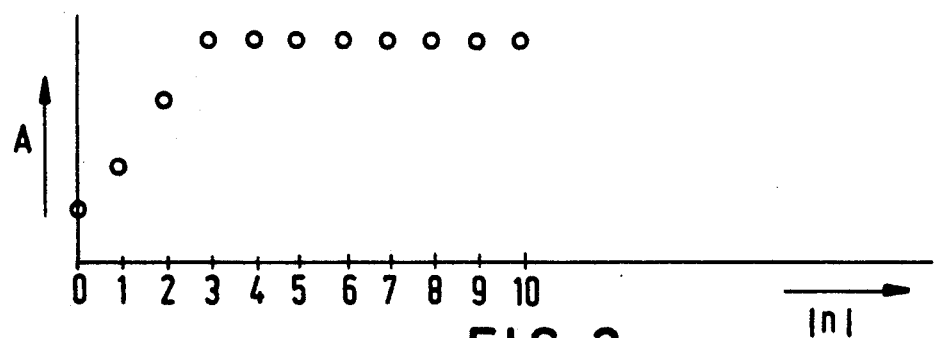
Figure 3B:
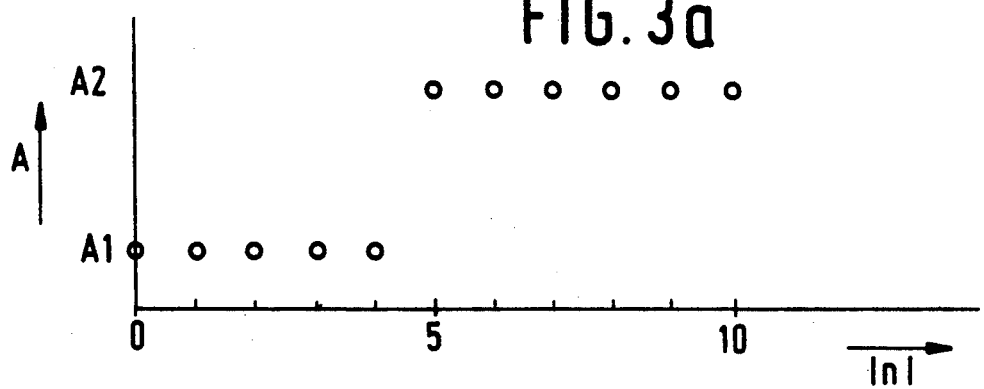

The invention can best be illustrated on the basis of a frequently occurring simple measuring cycle which is diagrammatically shown in FIG. 2. FIG. 2 shows various signals as a function of time which occurs during this measuring cycle. The amplitude ratio of these signals is not shown in proportion in the amplitude direction. The measuring cycle commences with a 90° pulse P1 at the instant t0 which is followed at the instant t1 by a second RF pulse P2, being a 180° pulse, thus generating a spin echo signal E whose centre will be situated at the instant t3. The interval between t0 and t1 is equal to the interval between t1 and t3. Between the RF pulses P1 and P2 usually two gradient fields, i.e. Gx and Gy1 are applied and during a sampling period after the RF pulse P2 a measuring gradient magnetic field Gy2 is applied. The gradient magnetic fields Gy1 and Gy2 are constant for each measuring cycle. As is known, the integral over the time t0-t1 of the gradient field Gx has a different value for each measuring cycle. For the echo signals for which this integral has a value zero or a comparatively low value, the echo signal E will exhibit a comparatively high amplitude. The integral of the gradient field Gx over the period t0-t1 in the successive measuring cycles is stepwise varied, the step size of said integral being the same for the various measuring cycles. When the integral has the value zero, the data set having the index 0 is measured. When the integral has the value of a first step which may be negative or positive, as indicated in FIG. 2, the data set having an index 1 or −1 is measured. When said integral over the gradient field Gx amounts to n steps, the data set having an index n is measured. In an embodiment of the magnetic resonance device in accordance with the invention the gain of the signal amplifier 14 is stepwise varied, under the control of the control unit 18B, in dependence of the absolute value of the index number n as shown in FIGS. 3a and 3b. For the index 0 the gain A is lowest, it being larger each time for the indices $|1|$ and $|2|$ and being constant for the indices $|n| \leq 3$. This is because in the present embodiment for the index number 3 a setting of the signal amplifier 14 is obtained where the signal noise of the signal measured has become substantially independent of the effect of the quantizing of the measured signal upon conversion by the ADC in the receiver chain. The index-dependent adjustment of the signal amplifier 14 can be implemented in various ways. For example, different settings of the signal amplifier 14 can be stored in a table, the type of measurement, such as 3-dimensional multiple slice or single slice, the set of parameters of RF pulses to be used for the type of measurement, gradient fields to be applied, etc. and a parameter in the form of an estimate of the object in the examination space being used for selecting the gain factor for the various data sets to be measured which factor is adjusted under the control of the control unit 18B.

A second, more practical implementation is the following. Some test measurements are performed on the object arranged in the examination space 28, these date sets are then measured for which the signal strengths of the resonance signal to be generated are highest. In dependence thereof, gain factors can be determined on the basis of the data set measured, said factors being stored in a table and, as soon as the actual measurement commences, the appropriate gain factor is read from the table in order to adjust the signal amplifier 14 during the execution of a measuring cycle with the relevant data set index number.

A further possibility of estimating the amplitudes to be expected during the successive measurements of resonance signals consists of a single test measurement during which no preparatory gradient magnetic field is applied. The resonance signal is generated, for example by means of a spin echo method and is sampled in the presence of a measuring gradient magnetic field. If in the gradient direction of the measuring gradient magnetic field the object has the same type of properties (type(s) of matter and distributions thereof) as in the preparatory gradient magnetic field direction, the signal sample associated with the image frequency $|kx|=1$; $|kx|=2$ etc. offers a suitable estimate of amplitudes to be expected for the data sets having the index numbers 1 and $-1$; 2 and $-2$; etc.

Evidently, it is also possible to omit the test measurements and to check during each measurement whether the generated amplitudes are to high to be processed via the ADC. If this is the case, the measurement is repeated, the signal amplifier then having a lower gain setting or an attenuator connected to the signal amplifier having a higher attenuation. The foregoing is attractive notably if the gain of the resonance signal has only two values: A1 and A2 as shown in FIG. 3b.

The foregoing means that in the present example the measuring cycles having an index $|n| \leq 5$ are repeated and all measuring cycles for which $|n| \geq 5$ are not repeated. Furthermore, an analog-to-digital converter (ADC) 18C should apply not only the digitized resonance signal via the connection 19A but also an overflow signal (in a case of excessively high amplitude of the resonance signal) via the connection 19B to the processing and control device 18B, so that the device 18B can suitably adjust the signal amplifier 14.

We claim:

1. A magnetic resonance device for determining a nuclear magnetization distribution in a region in an object, which device comprises:
   (a) means for generating a steady, uniform, magnetic field,
   (b) means for generating RF electromagnetic radiation in order to generate magnetic resonance signals,
   (c) means for generating at least one gradient magnetic field with an adjustable gradient direction for influencing the magnetic resonance signals,
   (d) a detection chain comprising a signal amplifier for detecting, amplifying and sampling the resonance signals during a measuring period, including an analog-to-digital converter which is connected thereto,
   (e) processing means for processing the sampled resonance signals, and
   (f) control means for controlling at least the means specified in subdivisions (b) to (e) in a manner that resonance signals are conditioned during a preparation period preceding the measuring period, the control means supplying the gradient field generating means with control signals for adjusting the strength and/or the duration of at least one gradient field so that the integral of the strength of the gradient magnetic field over the preparation period is different from each conditioned corresponding resonance signal to be sampled, characterized in that there are provided adjusting means for adjusting a gain of the amplifier so that the gain is increased when the signal level of a resonance signal conditioned by a last preparation period decreases with respect to a corresponding resonance signal conditioned by a preparation period prior to the last preparation period, until the noise factor of the detection chain and the analog to digital converter connected thereto has become substantially independent of the gain.

2. A magnetic resonance device as claimed in claim 1, characterized in that the signal amplifier has only two gain settings.

3. A magnetic resonance device as claimed in claim 1, wherein the integral of the gradient magnetic field in the preparation period for each measuring period is characterized by an index number and when said index number is in excess of a predetermined value the signal amplifier gain is increased.

4. A magnetic resonance device as claimed in claim 1, characterized in that the processing device comprises programmed means for repeating a measuring cycle and for adjusting a lower amplifier gain in the detection chain after reception of an overflow signal from the analog-to-digital converter.

5. A magnetic resonance device as claimed in claim 1, characterized in that the processing and control unit is programmed so that measuring cycles executed with a low gain are repeated, the resonance signals of these measuring cycles which have passed the analog-to-digital converter being averaged.

6. A magnetic resonance device as claimed in claim 1, characterized in that the processing unit comprises an amplifier setting register in which gain settings are stored which are determined on the basis of at least one resonance signal generated during a test measuring cycle executed prior to a measurement.

7. A magnetic resonance device as claimed in claim 3, characterized in that the signal amplifier has only two gain settings.

8. A magnetic resonance device as claimed in claim 4, characterized in that the signal amplifier has only two gain settings.

9. A magnetic resonance device as claimed in claim 5, characterized in that the signal amplifier has only two gain settings.

10. A magnetic resonance device as claimed in claim 6, characterized in that the signal amplifier has only two gain settings.

11. A magnetic resonance device as claimed in claim 6, wherein the integral of the gradient magnetic field in the preparation period for each measuring period is characterized by an index number and when said index number is in excess of a predetermined value the signal amplifier gain is increased.

12. A magnetic resonance device as claimed in claim 2, wherein the integral of the gradient magnetic field in the preparation period for each measuring period is characterized by an index number and when said index number is in excess of a predetermined value the signal amplifier gain is increased.

13. A magnetic resonance device as claimed in claim 1, wherein the adjusting means decreases the gain should overdriving occur, and the resonance signals measured are corrected as regards amplification or as regards amplification and phase.

14. A magnetic resonance device as claimed in claim 2, wherein the adjusting means decreases the gain should overdriving occur, and the resonance signals measured are corrected as regards amplification or as regards amplification and phase.

15. A magnetic resonance device as claimed in claim 3, wherein the adjusting means decreases the gain should overdriving occur, and the resonance signals measured are corrected as regards amplification or as regards amplification and phase.

* * * * *